United States Patent [19]

Schmidt et al.

[11] 4,415,930
[45] Nov. 15, 1983

[54] ADJUSTABLE POTENTIOMETER ASSEMBLY FOR TUNING MULTI-BAND TELEVISION RECEIVERS

[75] Inventors: Hans Schmidt, Wood Dale; Robert A. Wolff, Lombard, both of Ill.

[73] Assignee: Matsushita Electric Industrial Co., Ltd., Osaka, Japan

[21] Appl. No.: 337,488

[22] Filed: Jan. 6, 1982

[51] Int. Cl.³ .............................................. H04N 5/44
[52] U.S. Cl. .................................. 358/191.1; 455/180
[58] Field of Search ...................... 358/191.1; 455/180

[56] References Cited

U.S. PATENT DOCUMENTS

| | | |
|---|---|---|
| 3,965,427 | 6/1976 | Ma ........................................ 455/180 |
| 3,990,027 | 11/1976 | Kawashima . |
| 4,023,106 | 5/1977 | Utsunomiya . |
| 4,047,112 | 9/1977 | Sakamoto . |
| 4,050,050 | 9/1977 | Nakanishi et al. . |
| 4,054,853 | 10/1977 | Tarr et al. . |
| 4,055,822 | 10/1977 | Rinderle . |
| 4,061,982 | 12/1977 | Kawashima . |
| 4,081,771 | 3/1978 | Hendrickson . |
| 4,110,721 | 8/1978 | Nakanishi et al. . |
| 4,138,653 | 2/1979 | Midgley . |
| 4,160,964 | 7/1979 | Ishikawa et al. . |
| 4,204,166 | 5/1980 | Araki . |
| 4,249,255 | 2/1981 | Molinari . |
| 4,270,218 | 5/1981 | Smirl . |

*Primary Examiner*—Richard Murray

[57] ABSTRACT

An adjustable potentiometer assembly provides tuning voltages for application to a varactor diode tuner in a television receiver. The assembly includes a substrate having distributive resistive elements formed thereon each with a tuning area at which the correct tuning voltage is established. The distributive resistive elements are formed in at least one row with the tuning areas aligned. In addition, the width or tuning range of the tuning areas for each channel are substantially equal.

10 Claims, 7 Drawing Figures

FIG. 2.
FIG. 1.
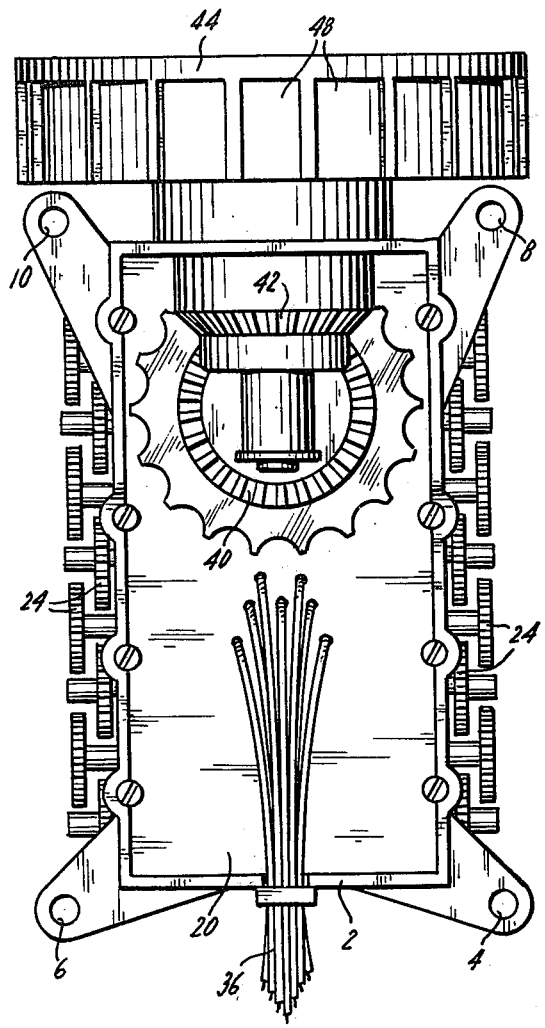
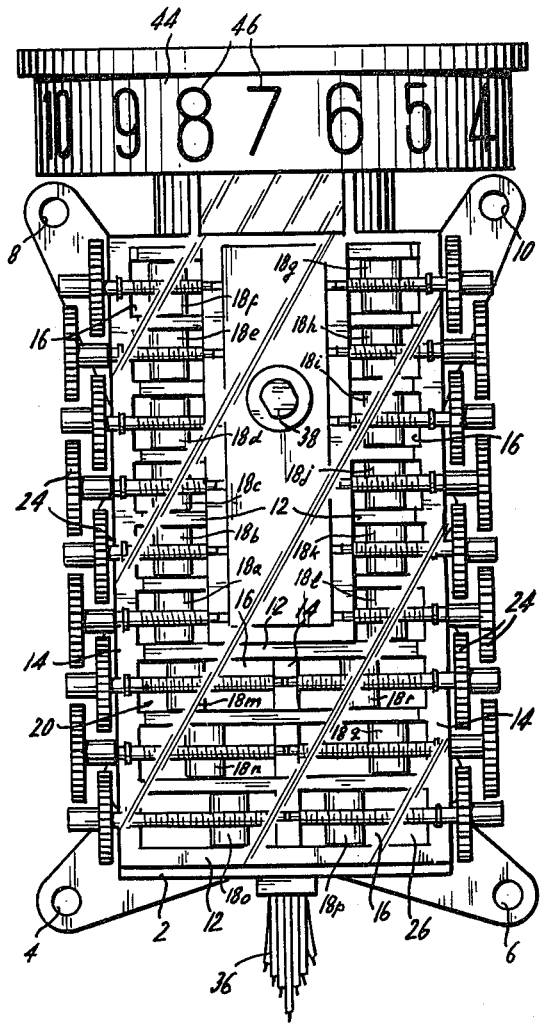
FIG. 6.
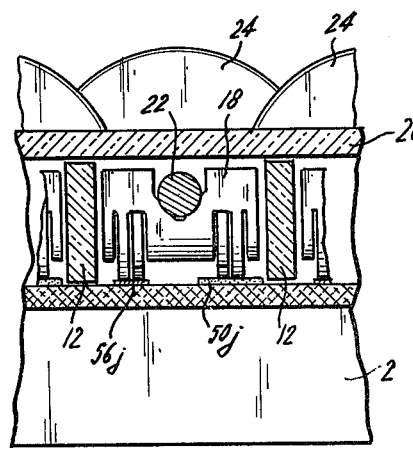

ADJUSTABLE POTENTIOMETER ASSEMBLY FOR TUNING MULTI-BAND TELEVISION RECEIVERS

DESCRIPTION OF THE INVENTION

The invention relates to tuners for multi-band television receivers and more particularly to an adjustible potentiometer assembly suitable for producing tuning voltages for application to a television tuner including varactor diodes as the frequency determining elements to permit selection of individual television channels.

In the United States, three ranges or bands in the electromagnetic radio spectra have been allocated for television broadcasts and reception. These are from 54 to 88 megahertz (mhz), from 174-216 mhz and from 470-890 mhz. These ranges or bands are further divided into individual channels, each having a fixed band width. There are five channel (2-6) in the first band, seven channels (7-13) in the second band and 70 (14-83) in the third band. The two lower bands (channels 2-13) are referred to as a single band, namely, very high frequency or VHF band; the other band (channels 14-83) is referred to as the ultra-high frequency or UHF band.

For many years, two separate turret type tuners have been employed in television receivers; one tuner to select the VHF channels and the second tuner to select the UHF channels. For most television receivers, this requires two different selection knobs. The tuners themselves are relatively bulky and require a relatively large amount of space within the television receiver cabinet. It is also necessary to locate these tuners behind the front panel of the receiver cabinet, thereby imposing significant restrictions on cabinet design and the arrangement of parts within the cabinet. Consequently, design flexibility in the arrangement of the parts within the television cabinet is considerably restricted.

It is desirable and often necessary to provide a system for selection of both the VHF and UHF channels in a comparable manner. Such requirement imposes significant problems in the use of mechanical turret-type tuners, and it has been found difficult to design such mechanical turret-type tuners to meet the requirements of comparable tuning for both the VHF and UHF channels.

With the introduction of voltage-variable capacitors, also known as varactor diodes, and their use in varactor tuners, electronic tunings for the VHF and UHF bands for television receivers was made possible. Typical channel selection circuits for television receivers using varactor diodes include a high frequency amplifier, a mixer stage, and a local oscillator circuit. A tuning input varactor diode, interstage turning varactor diodes and a local oscillator varactor diode are coupled to the high frequency amplifier, mixer stage and local oscillator respectively. Application of predetermined tuning voltages to the varactor diodes permits selection of desired channels by rotation of an appropriate selector knob.

Electronic tuning permits replacement of the mechanical turret-type tuners with arrangements permitting greater flexibility in the design of the channel selection panel and in the location of the various tuner parts within the receiver cabinet. It also permits comparable tuning for both the VHF and UHF channels. If the receiver, however, is to be made capable of individual selection of a large number of the 70 UHF channels in addition to the VHF channels, it is necessary to provide a large number of individual tuning components. Heretofore, arrangements of discrete fixed and variable resistors have been used to produce the individual tuning voltages required to tune the receiver to selected UHF and VHF channels. In such arrangements, each variable resistor must be precisely adjusted to insure that the proper tuning voltage is applied to the varactor diodes for each television channel to be selected by the television receiver. This adjustment is time consuming. Furthermore, the tuning range or turning area over which the variable resistor could be set for development of the proper tuning voltage for a particular channel varies widely from channel to channel. Furthermore, if one of the variable resistors was defective, it would have to be replaced, since the combinationn of fixed and variable resistors made it difficult and often impossible to utilize the resistor network for an adjacent and unused channel in place of the defective resistor network.

Accordingly, it is an object of the invention to overcome these and other problems in the prior art and provide a television tuning control system which permits the television receiver to be tuned to any VHF or UHF channel, which tuning is accomplished in a more precise manner.

It is another object of the invention to provide an adjustable potentiometer assembly for providing the required tuning voltages for an electronic television tuner.

It is another object of the invention to provide an adjustable potentiometer assembly for providing tuning voltages which is relatively easy to manufacture.

Still further, it is an object of the invention to provide an adjustable potentiometer assembly which can be precisely set to provide tuning voltages for an electronic television tuner.

It is a still further and more specific object of the invention to provide an adjustable potentiometer assembly which visually indicates when the proper tuning voltage for all VHF channels has been established.

It is another object of the invention to provide an adjustable potentiometer assembly in which the tuning area or tuning range for each variable resistor is substantially the same.

These and other features and objects of the invention are carried out in accordance with the invention in which an adjustable potentiometer assembly is provided for producing tuning voltages for application to a television tuner including varactor diodes as the frequency determining elements. The adjustable potentiometer assembly includes a substrate and a plurality of distributed resistive elements equal in number to the number of channels to which the receiver can be tuned formed on the substrate. Typically, the substrate has 18 resistive elements, one for each of the 12 VHF channels and for 6 UHF channels. Although not limiting of the invention, the present tuner requirements in the United States require that the television receiver be capable of receiving all VHF and UHF channels. While provision need be made for setting the receiver for selection on only 6 of the UHF channels at a particular time, the receiver must be capable of being set to receive any UHF channel. Generally, different UHF channels will be available for selection in different parts of the United States. Thus, as a practical matter, the greatest advantage of this invention lies in obtaining tuning voltages for the VHF channels which will be the same for all television sets used in the United States. To this end, the resistive elements are arranged on the substrate in a row or a plurality of rows. The tuning voltage provided by each resistive element is developed at a particular tuning area of each resistive element. The tuning areas each have substantially equal width so that the tuning voltage for each channel is obtained over the same tuning range. In addition, the tuning areas of the resistive elements in each row are aligned so that the appropriate tuning voltage can be readily and visually selected.

In one particular embodiment of the invention, the substrate has two rows of distributed resistive elements selectively coupled to conductive traces formed on the substrate. Conductive strips are formed on the substrate adjacent to the resistive elements. Voltage pick-up means in the form of contact wipers are mounted on lead screws for movement relative to each resistive element. The contact wipers make electrical contact between portions of the resistive elements and adjacent portions of the conductive strips. The tuning voltage for each channel is selected by positioning the contact wiper at the tuning area for each resistive element. Since the tuning areas for the resistive elements in each row are aligned, the proper tuning voltages are visually set by aligning the contact wipers, for example, at the center of each resistive element.

A more detailed understanding of the invention will be obtained from the following description, taken together with the accompanying drawings, in which:

FIG. 1 is a front elevational view of the adjustable potentiometer assembly of the invention;

FIG. 2 is a rear elevational view of the adjustable potentiometer assembly;

Figure 3:
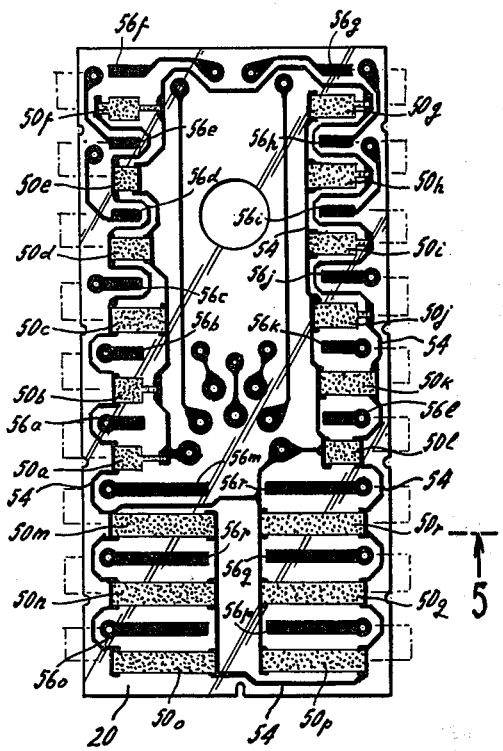
FIG. 3 is a front elevational view of the substrate showing two rows of resistive elements, adjacent conductive strips and conductive traces for establishing tuning voltages for tuning the television receiver to VHF channels 2 to 13 and 6 of the UHF channels.
Figure 5:
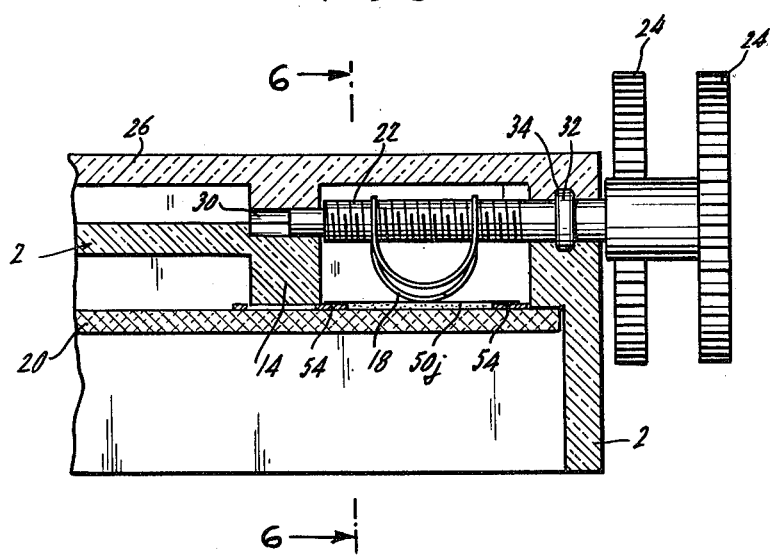
FIG. 5 is a sectional view taken along line 5—5 of FIG. 4 showing further details of the wiper arm and lead screw for setting the proper tuning voltages.
Figure 7:
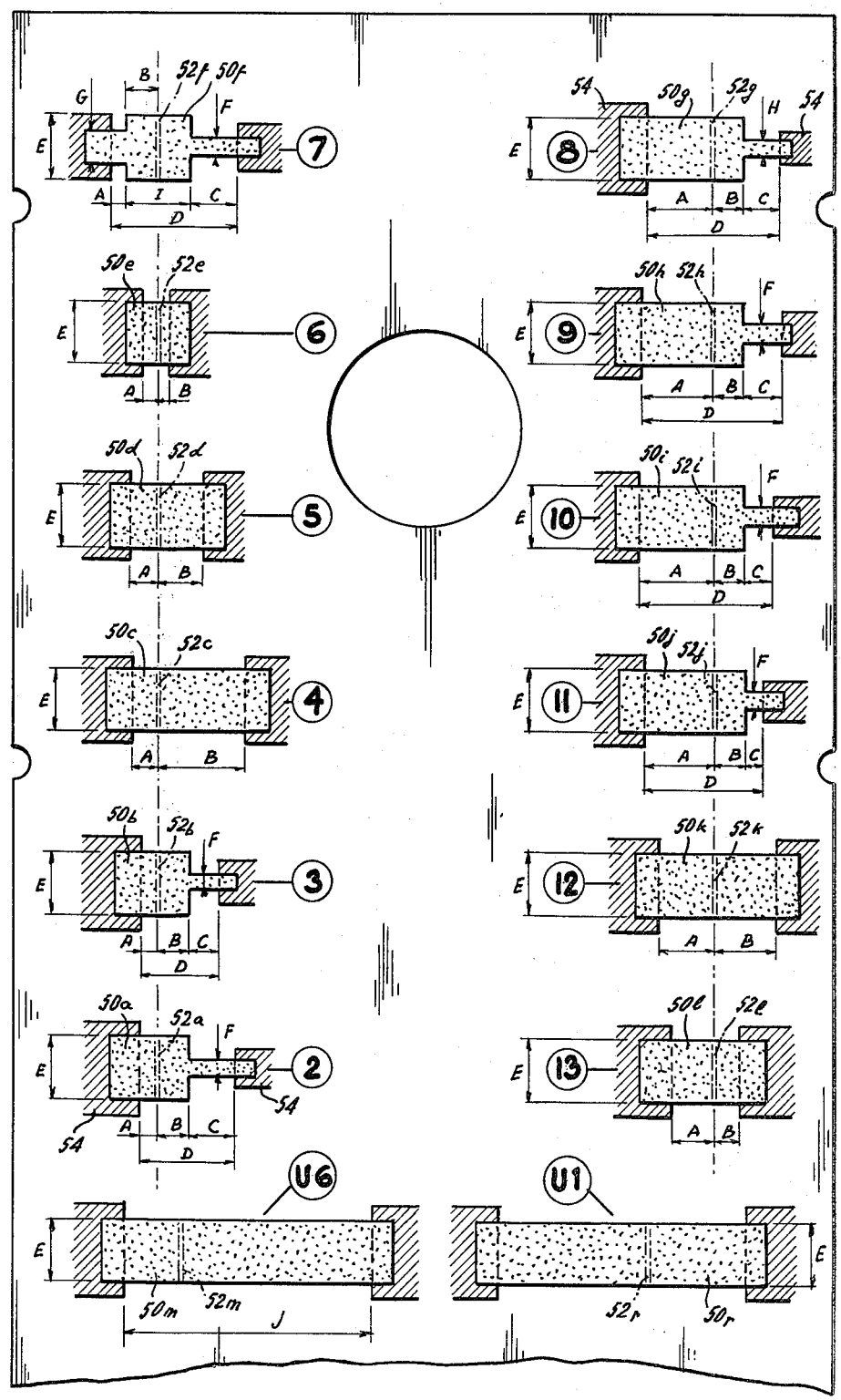

FIG. 6 is a sectional view taken along line 6—6 of FIG. 5 and showing further details of the wiper arm; and FIG. 7 is a schematic representation of the front elevational view of the substrate of FIG. 3 on a larger scale with the bottom portion broken away showing the resistive elements for VHF channels 2-13 and two resistive elements for two of the UHF channels useful for understanding the configuration of each of the resistive elements for VHF tuning and their arrangement with aligned tuning areas.

In a television receiver having an electronic tuner, the receiver is tuned to a particular channel typically by rotation of a channel selection knob located outside the receiver cabinet. An interior control which responds to rotation of the channel selection knob includes a selector mechanism having a plurality of VHF and UHF channel selection settings. A variable voltage system is mechanically and electrically coupled to the selector mechanism to provide selective predetermined tuning voltages to the television tuner. Each tuning voltage permits selection of one of the channels and such tuning voltage will be applied to the tuner each time the selector mechanism is set to a particular setting. Each of the tuning voltages is independently controllable and is set at the factory or in the viewer's home so that each time the selector mechanism is set to a particular channel, the proper tuning voltage is supplied to the television tuner. In accordance with the present invention, an adjustable potentiometer assembly provides the proper tuning voltages for the television tuner and is arranged so that the proper tuning voltage for each channel can be readily obtained.

Figure 4:
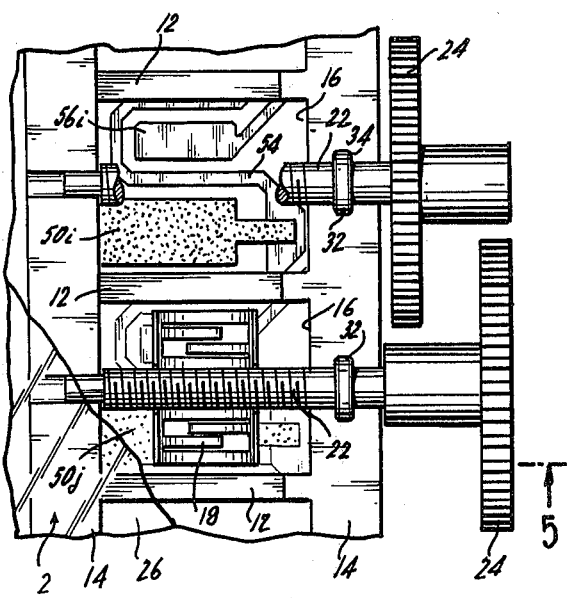
FIG. 4 is a portion of the front elevational view of FIG. 1 on a larger scale, partially further broken away to show details of the adjustable potentiometer assembly for providing tuning voltage for tuning to representative channels 10 and 11.

Referring to FIGS. 1 and 2, the potentiometer assembly includes a housing 2, formed of plastic or other insulating material, for supporting the components of the assembly and for permitting the assembly to be mounted to an appropriate portion of the television receiver by suitable mounting connections through holes 4, 6, 8 and 10 of housing 2. Housing 2 has a plurality of forwardly-extending lateral ribs 12 and longitudinal ribs 14 which define a plurality of lateral slots 16 between adjacent ribs. Contact wipers 18a through 18r are guided for axial movement in their respective lateral slots 16. Contact wipers 18 make electrical contact with distributed resistive elements and conductive elements formed on a thick film polymer substrate 20 which is mounted in housing 2 behind contact wipers 18. Each contact wiper 18 is mounted for axial movement on a lead screw 22 having opposite ends journalled for rotation relative in housing 2. A thumb wheel 24 firmly attached to the outboard end of each lead screw 22 is used to cause rotation of lead screws 22 and corresponding axial movement of contact wipers 18 in lateral slots 14 with respect to the distributed resistive elements and the conductive elements on substrate 20. A clear plastic cover 26 overlays the contact wipers 18 and lead screws 22. As illustrated in FIGS. 4 and 5, the inboard end 28 of each lead screw 22 is supported in a slot 30 formed between the housing 2 and the plastic cover 26. A collar 32 formed near the outboard end of lead screw 22 is supported in a second slot 34 between the housing 2 and cover 26 to prevent the lead screws 22 from moving axially relative to housing 2 and substrate 20.

Contact wipers 18a-18l are used to provide tuning voltages for tuning a television receiver to the VHF channels 2-13, respectively. Contact wipers 18m-18r are used to provide tuning voltages for tuning to six of the available UHF channels. Tuning voltages are applied to the conventional varactor diode television tuner via the electrical wires in harness 36. All television receivers must be arranged to receive the twelve VHF channels. The six UHF channels that a particular receiver will receive depends upon the part of the country in which the receiver is located and the particular choice of the television viewer, if more than six UHF channels are available. Thus, each wiper arm 18 in the UHF portion of the adjustable tuner assembly must be capable of providing a wide range of tuning voltages so that a particular tuning voltage can be selected for tuning to various selected UHF channels, whereas in the VHF portion of the adjustable tuner assembly, each wiper arm 18 must provide a predetermined tuning voltage for each VHF channel. In the illustrated embodiment of the invention, the VHF tuning voltages for channels 2-6 are established when the contact wiper arms 18a-18f respectively are aligned and the VHF tuning voltages for channels 7-13 are established when contact wiper arms 18g-18l respectively are aligned. In this way, the proper tuning voltages can be established by a visual indication to provide proper tuning. While it could be possible to provide visually aligned tuning for the UHF channels, the large number of possible channels and the corresponding requirement for selection of any of the channels makes that a practical impossibility in a television receiver which must be capable of being tuned to any of the available UHF channels.

The television set is tuned by rotation of a knob (not shown) on the outside of the television receiver cabinet which is attached to shaft 38 of the adjustable potentiometer assembly. This, in turn, causes rotation of detent and miter gear 40 and bevel gear 42. Electrical contacts (not shown) in front of detent and miter gear 40 make electrical contact with conventional conductive traces (not shown) formed on the back of substrate 20 (FIG. 2) to couple tuning voltages to the tuner for the particular channel selected by the viewer. This arrangement is conventional and will not be described further. Rotation of bevel gear 42 causes rotation of drum readout 44 which has individual illuminated indicia 46 for the VHF channels 2-13 and six blank partitioned areas 48 for insertion of indicia for six UHF channels that can be selected by the receiver. The indicia can be read through an appropriate window in the television receiver cabinet to provide a visual indication of the channel to which the receiver is tuned.

Referring to FIGS. 3 and 7, two rows of distributed resistive elements 50a–50r are formed on the surface of substrate 20 from a resistive ink of known resistance per square. Distributed resistive elements 50a–50l are used in cooperation with corresponding contact wipers 18a–18l to develop tuning voltages for each of the twelve VHF channels. The resistive elements 50a–50l are configured to establish tuning areas 52a–52l respectively in the resistive elements whereat the proper tuning voltages for the particular VHF television channels are developed. The resistive elements 50a–50l are arranged so that tuning areas 50a–50f and tuning areas 52g–52l are aligned. Thus, contact wipers 18a–18f and 18g–18l can be visually aligned at the tuning areas over their respective resistive elements to provide proper tuning for each VHF channel. Distributive resistors 50m–50r are used for establishing tuning voltages for six of the UHF channels, the particular channel being selected by the particular setting of the cooperating contact wipers 18m–18r. Distributive resistors 50m–50r are formed to permit selection of a tuning voltage for any UHF channel. Therefore, tuning areas (e.g., 52m and 52r, FIG. 7) are not necessarily aligned with the tuning areas 52a–52f and 52g–52l, respectively. All of the tuning areas 52a–52r are substantially equal so that the proper tuning voltage is established over an equal tuning range for all resistive elements. This feature simplifies receiver tuning.

Conductive traces 54 are formed on substrate 20 in electrical contact with opposite ends of resistive elements 50a–50r. Conductive traces 54 are used to apply a constant potential difference across the resistive elements 50a–50r which is conveyed to the conductive traces by the electrical wires in harness 36 and appropriate connections on substrate 20. Conductive strips 56a–56r are formed on substrate 20 adjacent resistive elements 50a–50r, respectively. Respective contact wipers 18a–18r make electrical contact between resistive elements 50a–50r and adjacent conductive strips 56a–56r to produce the tuning voltage for application to the tuner.

Referring now to FIG. 7, there is shown an enlarged front view of substrate 20 showing resistive elements 50a–50l for the twelve VHF channels 2-13 respectively and resistive elements 52m and 52r for two of the UHF channels. Portions of the conductive tracers 54 electrically connected to the opposite ends of resistive elements 50 are also shown. In this typical example, resistive ink, having a resistance of 30 kilohms per square is used to form the resistive elements. The resistive elements are configured so that tuning areas 52a–52l, 52m–52r are established in each resistive element at which the proper tuning voltage is developed for application to the television tuner for tuning to selected television channels. The tuning area of each resistive element is approximately 0.25 millimeters wide. Tuning areas 52a–52f and 52g–52l respectively are aligned and preferably are formed as the center of travel for the corresponding contact wipers 18a–18f and 18g–18l. Thus, to provide the proper tuning voltage for the VHF channels, each contact wiper 18 is set to the center of its travel along its carrying lead screw 22 and aligned with the other contact wipers in its row, thereby providing a quick and easy setting of the tuning voltages. The specific dimensions for each of the resistive elements are set forth in Table 1 below.

TABLE 1

| Resistive Element | Channel | Dimensions | | | |
|---|---|---|---|---|---|
| | | A(mm) | B(mm) | C(mm) | D(mm) |
| 50a | 2 | 1.0352 | 2.0 | 2.801395 | 5.837115 |
| 50b | 3 | 0.97923 | 2.0 | 1.6525366 | 4,6105715 |
| 50c | 4 | 1.211706 | 5.803594 | | |
| 50d | 5 | 1.581522 | 2.996678 | | |
| 50e | 6 | 0.99474 | 0.72396 | | |
| 50f | 7 | 0.79654 | 2.0 | 2.7768257 | 7.5733657 |
| 50g | 8 | 3.80224 | 2.0 | 1.976432 | 7.778672 |
| 50h | 9 | 4.330274 | 2.0 | 2.1004565 | 8.4307305 |
| 50i | 10 | 4.245974 | 2.0 | 1.7123065 | 7.9582805 |
| 50j | 11 | 3.9081575 | 2.0 | 1.1337107 | 7.0418682 |
| 50k | 12 | 3.217372 | 3.956528 | | |
| 50l | 13 | 2.44959 | 1.69611 | | |
| Dimensions For All Channel Resistive Elements | | | | | |
| E(mm) | | 4 | | | |
| F(mm) | | 1 | | | |
| G(mm) | | 2 | | | |
| H(mm) | | 0.8 | | | |
| J(mm) | | 15 | | | |

Sometimes, the distributed resistive elements, or conductive traces, or conductive strips may be defective, thereby preventing proper tuning to a particular desired channel (e.g., channel 2) using those elements. Rather than discard the entire substrate, it may be possible to utilize an adjacent resistive element, conductive trace and conductive strip normally associated with an open adjacent channel (e.g., channel 3) to establish the proper tuning voltage for the particular channel by repositioning the contact wiper arm associated with the resistive element for the open channel to provide the proper tuning. The desired channel (e.g., channel 2) can then be selected by setting the selection knob on the front of the receiver to the unused channel (e.g., channel 3). In the prior systems for developing tuning voltages using a network of fixed and variable resistors, if the resistors for one channel were defective, it was difficult and often impossible to use the resistors from adjacent channels in this way, and the entire resistive network would have to be replaced.

Referring back to FIGS. 4–6, a typical contact wiper 18j is shown. Each contact wiper is formed from a spring-like metal having a pair of arcuate spring-like members 60a, 60b formed on opposite sides of lead screw 22 which depend downwardly into contact with resistive element 50j and adjacent conductive strip 56j. The central portion of contact wiper 18j is cut out and rides in the screw threads of lead screw 22. Thus, spring elements 60a, 60b of contact wiper 18 are compressed between substrate 20 and lead screw 22 to promote good electrical contact between the resistive and conductive elements and good mechanical contact with lead screw 22.

What has been described is the presently preferred embodiment of the adjustable potentiometer assembly of the invention. Those skilled in the art will recognize that many modifications can be made to the described embodiment while still coming within the scope of the invention, which is set forth in the appended claims.

What we claim is:

1. In a television receiver, including a television tuner having varactor diodes responsive to predetermined tuning voltages selectively applied thereto for tuning the television receiver to a desired television channel, an adjustable potentiometer assembly for establishing tuning voltages for selection of television channels, comprising: a housing, a substrate mounted in said housing, a plurality of distributed resistive elements equal in number to the number of channels to be selected formed on said substrate in at least one row, each of said resistive elements being arranged with a tuning area to permit a predetermined tuning voltage to be selectively coupled from said tuning area of said resistive elements to the varactor diodes in the television receiver for selecting a desired television channel, and a plurality of voltage pickup members adjustibly contacting said distributed resistive elements for selectively coupling the tuning voltages to the varactor diodes, said resistive elements being positioned on said substrate such that all of said tuning areas are aligned so that said voltage pickup members can be readily adjusted to provide appropriate tuning voltages for selection of each channel.

2. The adjustable potentiometer assembly of claim 1, wherein the number of said resistive elements equals the number of VHF channels.

3. The adjustable potentiometer assembly of claim 1, wherein the tuning range of each of said tuning areas is substantially equal.

4. An adjustible potentiometer assembly for use in a television receiver including a television tuner having varactor diodes responsive to predetermined tuning voltages selectively applied thereto for tuning the television receiver to a desired television channel, comprising: a housing, a substrate mounted in said housing, a plurality of distributed resistive elements equal in number to the number of channels to be selected formed on said substrate in at least one row, each of said resistive elements being arrranged with a tuning area, the tuning range of said tuning areas being substantially equal to permit a predetermined tuning voltage to be selectively coupled from said tuning area of said resistive elements to the varactor diodes in the television receiver for selecting a desired television channel, and a plurality of voltage pickup members adjustibly contacting with said distributed resistive elements for selectively coupling the tuning voltages to the varactor diodes.

5. The adjustible potentiometer assembly of claim 4, wherein said tuning areas are aligned.

6. An adjustible potentiometer assembly for use in a television receiver to select a VHF channel by establishing preselected tuning voltages for application to a television tuner including varactor diodes as the tuning elements thereof, comprising: a housing, a substrate mounted in said housing, conductive metal traces formed on said substrate in a preselected pattern, at least two rows of distributed resistive elements equal in number to the VHF channels formed on said substrate, each of said resistive elements having a tuning area, a plurality of coupling members for selectively coupling said resistive elements to said conductive metal traces to permit predetermined tuning voltages necessary to tune the television receiver to selected VHF channels to be applied to said tuner, each row of tuning areas being aligned to permit said assembly to be readily set for providing tuning voltages to each VHF channel.

7. An adjustible potentiometer assembly for use in a television receiver to provide preselected tuning voltages to a tuning including varactor diodes as the tuning elements thereof for tuning the television receiver to selected VHF channels, comprising: a housing, a substrate mounted in said housing, conductive metal strips formed on said substrate in preselected patterns, at least two rows of elongated distributed resistive elements equal in number to the number of VHF channels formed on said substrate and selectively coupled to said electrical conductive metal traces, each of said resistive elements including a tuning area having a tuning range substantially equal to the tuning range of the other resistive elements whereat selected tuning voltages for tuning to the VHF channels are established, and a plurality of voltage pickup members equal in number to the number of the resistive elements and mounted in said housing for slidable motion with respect to said substrate, said voltage pickup members making electrical contact between said distributive resistive elements and said conductive metal traces for resistively coupling said tuning voltages to the television tuner.

8. The adjustible potentiometer assembly of claim 7, wherein said tuning areas in each row are aligned.

9. A substrate for use in an adjustible potentiometer assembly in a television receiver which includes a plurality of variable resistors for establishing preselected tuning voltages to selective application to a television tuner including varactor diodes as tuning elements thereof, comprising: conductive metal traces formed on said substrate in preselected pattern, at least one row of distributed resistive elements formed on said substrate as part of said variable resistors for selective coupling to said conductive metal traces, each of said resistive elements having a tuning area providing equal tuning ranges for each resistive element to permit tuning voltages necessary to tune a television receiver to a selected VHF channel to be established at said tuning areas for application to the television receiver.

10. The substrate of claim 9, wherein the tuning areas in each row of distributed resistive elements are aligned.

* * * * *